US006960282B2

(12) United States Patent
Bezama et al.

(10) Patent No.: US 6,960,282 B2
(45) Date of Patent: Nov. 1, 2005

(54) APPARATUS FOR CLEANING RESIDUAL MATERIAL FROM AN ARTICLE (75) Inventors: Raschid Jose Bezama, Mahopac, NY (US); John F. Harmuth, Pleasant Valley, NY (US); Jason Scott Miller, Poughkeepsie, NY (US); Randall Jason Werner, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 268 days.

(21) Appl. No.: 10/026,264

(22) Filed: Dec. 21, 2001

(65) Prior Publication Data
US 2003/0116428 A1 Jun. 26, 2003

(51) Int. Cl.⁷ ............................................. C25D 17/00
(52) U.S. Cl. ........................ 204/224 R; 204/224 M; 134/103.2; 134/103.3; 134/172
(58) Field of Search ................ 204/224 R, 224 M; 134/103.2, 103.3, 172

(56) References Cited
U.S. PATENT DOCUMENTS

| | | | |
|---|---|---|---|
| 2,307,928 A * | 1/1943 | Hogaboom | 205/705 |
| 4,162,952 A * | 7/1979 | Tribout | 204/224 R |
| 4,483,040 A | 11/1984 | Magee et al. | 15/302 |
| 4,569,695 A * | 2/1986 | Yamashita et al. | 134/1 |
| 5,152,878 A | 10/1992 | Datta et al. | 205/717 |
| 5,543,032 A * | 8/1996 | Datta et al. | 205/670 |
| 5,849,173 A * | 12/1998 | Chandross et al. | 205/664 |
| 5,981,084 A | 11/1999 | Riabkov et al. | 428/612 |
| 6,032,683 A | 3/2000 | Casey et al. | 134/199 |
| 6,203,691 B1 | 3/2001 | Hoffman, Jr. et al. | 205/705 |
| 6,238,529 B1 * | 5/2001 | Geissler et al. | 204/202 |
| 6,277,799 B1 | 8/2001 | Sachdev et al. | 510/176 |
| 6,280,527 B1 | 8/2001 | Sachdev et al. | 134/2 |
| 6,383,303 B1 * | 5/2002 | Wee et al. | 134/2 |

FOREIGN PATENT DOCUMENTS

EP 870854 A1 * 10/1998 ............. C25F 1/00

* cited by examiner

Primary Examiner—Arun S. Phasge
(74) Attorney, Agent, or Firm—Ira D. Blecker (57) ABSTRACT An apparatus in which opposed nozzle assemblies are utilized to clean residual material, such as a metallic paste, from an article, such as a screening mask. Each of the nozzle assemblies has a first set of nozzles for spraying a cleaning agent onto the article in a first pattern to first chemically and mechanically remove residual material from the article. At least one of the nozzle assemblies has a second set of nozzles for spraying a cleaning agent onto the article in a second pattern while simultaneously applying a voltage between the second set of nozzles and the article to then chemically and electrolytically remove the remaining residual material from the article.

22 Claims, 7 Drawing Sheets

APPARATUS FOR CLEANING RESIDUAL MATERIAL FROM AN ARTICLE

RELATED APPLICATION

This application is related to U.S. patent application Ser. No. 10/026,239, entitled "PROCESS FOR ELECTROLYTICALLY CLEANING PASTE FROM A WORKPIECE", filed even date herewith, the disclosure of which is incorporated by reference herein.

BACKGROUND OF THE INVENTION

The present invention is directed to the cleaning of residual material from an article, and more particularly, is directed to the electrolytic cleaning of residual material from an article with a suitable cleaning agent. Most particularly, the present invention is directed to the electrolytic cleaning of paste residue from a screening mask utilizing tetra methyl ammonium hydroxide as the cleaning agent.

In the fabrication of multilayer ceramic substrates for the packaging of semiconductor devices, conductive metal patterns comprising wiring lines, vias, input/output pads and the like, are screened on individual ceramic greensheets through a screening mask. After screening, the greensheets are assembled and aligned, and laminated followed by a sintering operation to form a multilayer ceramic substrate. Fabrication techniques for such multilayer ceramic substrates, including design, screening equipment, and paste screening process are well known in the art.

However, advanced ground rule electronic packaging requires printing a closely spaced conductive metal pattern on the greensheets, and using a screening mask that has highly dense fine dimension etched features. It has been observed that such screening masks have the problem of paste residue entrapment in the mask features in addition to a surface residue when the paste is screened to deposit the conductive metal pattern. This requires that the screening mask be completely and efficiently cleaned after one or more screening passes to eliminate, or at least minimize, the possibility of defects in subsequently screened metal patterns. Any defects in the screened conductive metal pattern replicates into the final product causing yield losses. Moreover, in automated processes for high volume production of multilayer ceramic substrates, it is also necessary that the speed of mask cleaning be compatible with the cycle time preset by the throughput requirement and other dependent operations.

Conductive pastes used in screening the conductive metal patterns comprise metal particles mixed with an organic or inorganic binder and solvent vehicle along with wetting agents, dispersants, surfactants, plasticizers, thickening agents, antioxidants and coloring agents, all of which are well known in the fabrication of electronic components.

Most commonly used conductive pastes in multilayer ceramic fabrication are based on copper, gold, nickel, tin, solder, molybdenum or tungsten metal powders dispersed in an organic polymer binder such as, for example, ethyl cellulose, polymethyl methacrylate, or polyvinyl butyral, in a high boiling point solvent vehicle.

Various processes and apparatus have been proposed for cleaning screening masks. Magee et al. U.S. Pat. No. 4,483,040 and Casey et al. U.S. Pat. No. 6,032,683, the disclosures of which are incorporated by reference herein, disclose apparatus for cleaning paste residue from a screening mask in which a pressured spray is impinged upon the screening mask to mechanically and chemically remove the paste residue.

More recently, Sachdev et al. U.S. Pat. Nos. 6,277,799 and 6,280,527, the disclosures of which are incorporated by reference herein, disclose a particularly preferred process to clean the screening mask with a pressure spray of tetramethyl ammonium hydroxide (hereafter TMAH). While this process works well in practice, there is room for improvement in that it would be desirable to reduce the amount of TMAH that is used in the cleaning process as well as the time of the cleaning process.

Others have proposed electroclean processes for cleaning a variety of workpieces.

Hoffman, Jr. et al. U.S. Pat. No. 6,203,691, the disclosure of which is incorporated by reference herein, discloses an electrolytic method to electroclean by immersion or spraying a conductive body acting as a cathode to remove oxides or impurities. The electrolyte used is an aqueous solution of disodium phosphate and sodium bicarbonate having a pH between 7 and 9.

Riabkov et al. U.S. Pat. No. 5,981,084, the disclosure of which is incorporated by reference herein, discloses an electrolytic method to clean a conductive body acting as a cathode in a spray type cell in which an aqueous electrolyte is sprayed onto the body under pressure. The aqueous electrolyte comprises sodium carbonate, potassium carbonate, sodium chloride or sodium nitrate and may optionally contain a soluble salt of a suitable metal of which no examples are given.

Datta et al. U.S. Pat. No. 5,152,878, the disclosure of which is incorporated by reference herein, discloses an electrocleaning method to remove a metallic residue stain from a molybdenum mask. The electrolyte is comprised of phosphoric acid and glycerol.

Notwithstanding the above efforts in the prior art, there remains a need for an improved apparatus for cleaning paste residue from screening masks and the like.

Accordingly, it is a purpose of the present invention to have an improved apparatus for cleaning paste residue from screening masks and the like.

It is a further purpose of the present invention to have an improved apparatus for cleaning paste residue from screening masks and the like wherein an aqueous cleaning agent is used.

It is yet another purpose of the present invention to have an improved apparatus for cleaning paste residue from screening masks and the like that reduces the time of cleaning the screening masks while also reducing the amount of cleaning agent utilized.

These and other purposes of the invention will become more apparent after considering the following description in conjunction with the accompanying drawings.

BRIEF SUMMARY OF THE INVENTION

The purposes of the invention have been achieved by providing, according to a first aspect of the present invention, an apparatus for cleaning residual material from an article comprising:

a) a source of a cleaning agent;
 b) at least one pair of opposing spray nozzle assemblies directed to spray an article interposed between the opposing spray nozzle assemblies, a first of the opposing spray nozzle assemblies comprising a first nozzle for spraying the cleaning agent in a first pattern and a second nozzle for spraying the cleaning agent in a second pattern, and a second of the opposing spray nozzle assemblies comprising a first nozzle for spraying the cleaning agent in a first pattern;

c) a supply conduit from the source of the cleaning agent to each of the first and second nozzles;

d) a power source electrically connected to the second nozzle; and e) a transport apparatus to transport one of the opposing nozzle assemblies and the article with respect to each other;

f) wherein, in operation, in a first pass the first nozzle of at least the first nozzle assembly is operable to spray the article with a spray of the cleaning agent as the first nozzle assembly and article are transported with respect to each other to chemically and mechanically remove residual material from the article and in a second pass the second nozzle of the first nozzle assembly is operable to spray the article with a cleaning agent as a voltage is applied between the second nozzle of the first nozzle assembly and the article and as the first nozzle assembly and article are transported with respect to each other to chemically and electrochemically remove the remaining residual material from the article.

According to a second aspect of the invention, there is provided an apparatus for cleaning residual material from an article comprising:

a) a source of a cleaning agent;

b) at least one pair of opposing spray nozzle assemblies directed to spray an article interposed between the opposing spray nozzle assemblies with each of the opposing spray nozzle assemblies comprising a first nozzle for spraying the cleaning agent in a first pattern and a second nozzle for spraying the cleaning agent in a second pattern;

c) a supply conduit from the source of the cleaning agent to each of the first and second nozzles;

d) a power source electrically connected to the second nozzles; and e) a transport apparatus to transport one of the opposing nozzle assemblies and the article with respect to each other;

f) wherein, in operation, in a first pass the first nozzle of each of the nozzle assemblies is operable to spray the article with a spray of the cleaning agent as the nozzle assemblies and article are transported with respect to each other to chemically and mechanically remove residual material from the article and in a second pass the second nozzles of each of the nozzle assemblies is operable to spray the article with a cleaning agent as a voltage is applied between the second nozzles of each of the nozzle assemblies and the article and as the nozzle assemblies and article are transported with respect to each other to chemically and electrochemically remove the remaining residual material from the article.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

The present invention is principally concerned with an apparatus for removing screening paste residue from screening masks used in screening conductive paste patterns on ceramic greensheets in the manufacture of multilayer ceramic substrates. Moreover, the present invention is concerned with the cleaning of screening masks in high throughput multilayer ceramic substrate production. However, it should be understood that the present invention has general applicability to the cleaning of residual material, other than paste residue, from articles besides screening masks. Further, while the preferred cleaning agent for use in the present invention is TMAH, other cleaning agents may also be used in conjunction with the disclosed apparatus.

The manufacturing of multilayer ceramic substrates typically employs the technique of screening a conductive pattern on a ceramic greensheet through a stencil mask using a variety of polymer-metal composite pastes to delineate the conductive pattern for the desired circuitry. In this process, some paste residue is left behind on the surface of the mask as well as inside the very small features of the screening mask. The paste residue entrapped in the mask features and on the surface of the mask must be removed if the mask is to be reused for the screening of the conductive paste. In the production environment where automated screening and mask cleaning processes are utilized, mask cleaning may be done after one or more screening passes, otherwise the paste residue on the surface of the mask and in the mask features can cause defects in subsequently screened conductive patterns.

The screening masks utilized may be, for example, molybdenum, copper or a combination of copper and nickel (e.g., copper plated nickel).

As mentioned previously, the pressure spraying of TMAH works very well in a production environment to clean the screening masks. However, there are at least five reasons why an improved cleaning apparatus is desirable. First, it would be desirable to decrease the amount of time necessary for mask cleaning so as to increase the throughput of the screening apparatus. Second, the used TMAH or other cleaning agent must be cleaned and recycled or disposed of so it would be desirable to reduce the amount of TMAH or other cleaning agent used. Third, there are certain crevices or hidden spots which the sprayed TMAH or other cleaning agent can't reach with sufficient energy to chemically or mechanically remove all adhered paste. Fourth, electrolytically cleaning the mask prevents mask oxidation thereby preserving the pristine mask surface or if the mask is oxidized, electrolytically cleaning the mask will remove substantially all of the oxide. Fifth, electrolytically cleaning exhibits the potential to clean pastes that the standard production TMAH cleaning process is able to clean only with difficulty.

Accordingly, the present inventors have proposed an apparatus for removing residual material (usually paste residue) from an article (usually a screening mask)by first contacting the article with a spray of a cleaning agent which mechanically and chemically removes much of the residual material followed by contacting the article with an electrolytic spray of a cleaning agent to remove the remainder of the residual material. During the electrolytic portion of the process, the article, e.g., the screening mask, is contacted with an aqueous solution containing the cleaning agent, preferably TMAH, in an electrolytic cell. The article is made the cathode (−) while the spray nozzle of the apparatus is made the anode (+). The sprayed cleaning agent is the electrolyte. If the cleaning agent is TMAH, the concentration of the TMAH is 0.2 to 2 weight percent and most preferably 0.4 to 0.5 weight percent. The preferred concentrations of other cleaning agents can be determined by routine experimentation. The nozzle has to be close enough and the spray has to be sufficient to maintain an electrical circuit between the individual jets of the spray nozzle and the article. The present inventors believe that a distance of about 0.180 to 0.375 inches is sufficient. In general, the minimum distance should be about six times the diameter of the jets that make up the nozzle. Further details on a process for practicing the present invention can be elucidated from the above-noted RELATED APPLICATION.

Figure 1:
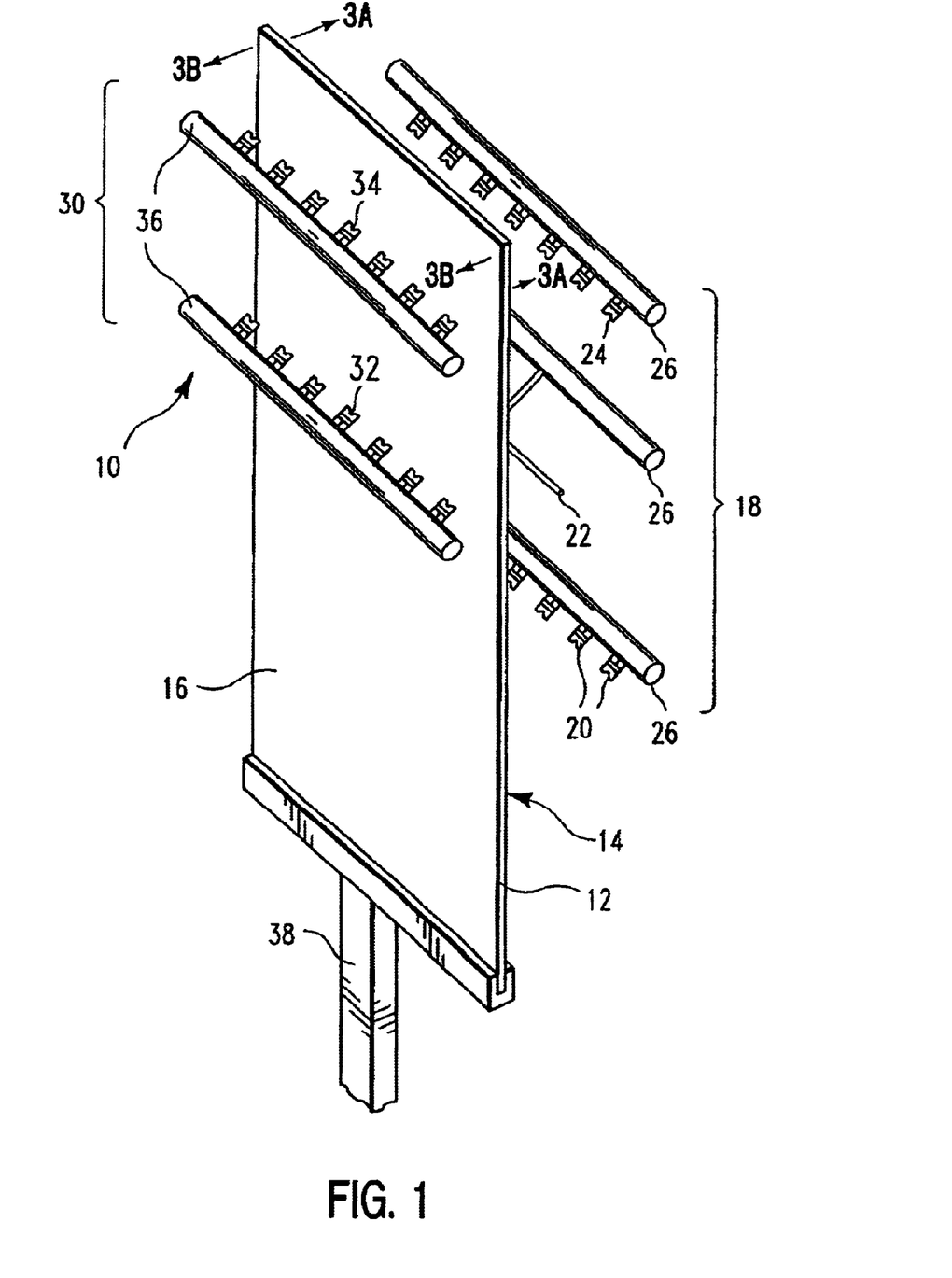
FIG. 1 is a perspective view schematically illustrating a first embodiment of the apparatus according to the present invention.

Referring to the Figures in more detail, and particularly referring to FIG. 1, there is shown a schematic representation of the present invention. The apparatus for cleaning residual material from an article according to the present invention and generally indicated by reference number 10 has the article 12 ready for cleaning. Article 12 has a front side 14 and a back side 16. When article 12 is a screening mask, most of the paste residue would be located on the front side 14 of the screening mask so in one embodiment of the present invention, the article or screening mask 12 would be mechanically and chemically cleaned from both sides, but primarily electrolytically cleaned from the front side only. However, it should be noted that anywhere the screening mask has through features, the electrolytic reaction will "wrap around" to the backside, thereby electrolytically cleaning the inside of the features and backside of the screening mask to a radius of 0.5 to 1.00 mm greater than the feature dimension. This is an important feature of the electrolytic cleaning process because in a screening operation it is imperative that the screening mask features be thoroughly cleaned inside and out.

Apparatus 10 includes a first nozzle assembly 18 and a second nozzle assembly 30. The first nozzle assembly 18 and second nozzle assembly 30 are opposed to one another so that the article 12 to be cleaned can be placed approximately in the middle between the two nozzle assemblies. The first nozzle assembly 18 comprises first nozzle 20 which sprays the article 12 in a first pattern which is meant to mechanically and chemically dislodge most residual material from the front 14 of the article 12 and a second nozzle 22 which sprays the article 12 in a second pattern which is meant to chemically and electrolytically remove the remaining residual material from the front 14 of the article 12. The apparatus 10 as shown in FIG. 1 further comprises the second nozzle assembly 30 which comprises a first nozzle 32 which sprays the article 12, and in a most preferred embodiment of the invention concurrently with the spraying of nozzle 22, in a first pattern which is meant to mechanically and chemically dislodge any residual material from the back 16 of the article 12 as well as to counterbalance the flow from nozzle 22. It should be understood that the various nozzles shown in FIG. 1 have been spaced apart, and apparatus not germane to the present invention have been removed, for the sake of clarity.

The first pattern from nozzles 20 and 32 is a higher velocity diverging pattern for most efficient bulk removal of the residual material while the second pattern from nozzle 22 is a continuous stream of lower velocity parallel jets so that there is continuous electrical path between nozzle 22 and article 12 through the parallel stream of cleaning agent.

Figure 3A:
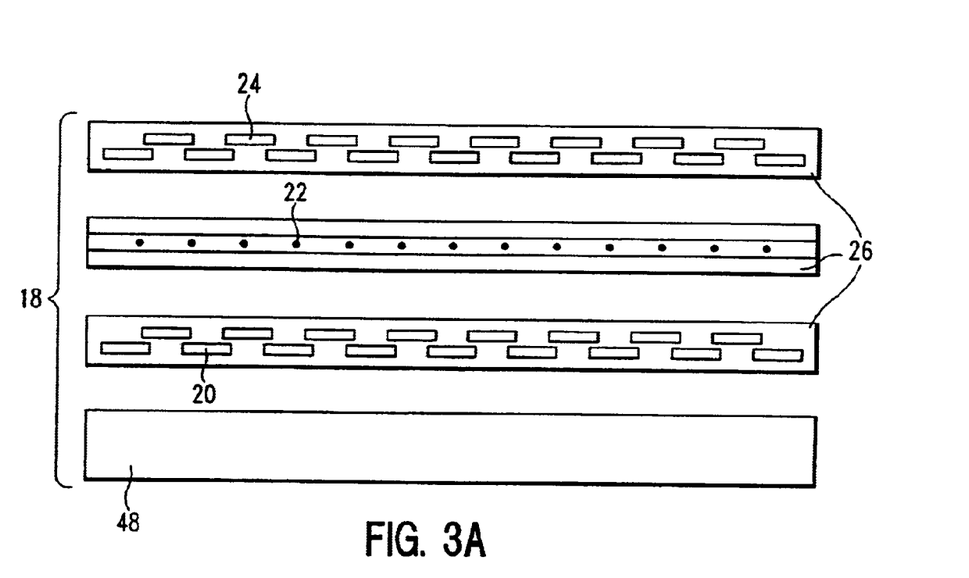
FIGS. 3A and 3B are frontal views in the direction of arrows 3A and 3B, respectively, in FIG. 1 schematically illustrating the first and second nozzle assemblies, respectively, of the first embodiment of the apparatus according to the present invention.
Figure 3B:
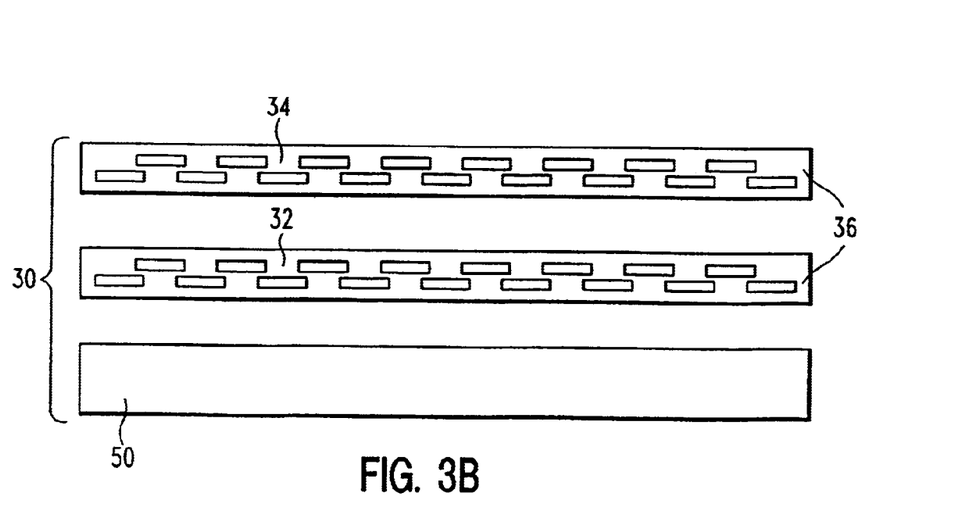

The arrangement of the nozzles of the first and second nozzle assemblies 18, 30 can also be seen in FIG. 3A which is a frontal view of the nozzles of the first nozzle assembly 18 in the direction of arrows 3A shown in FIG. 1 while FIG. 3B is a frontal view of the nozzles of the second nozzle assembly 30 in the direction of arrows 3B shown in FIG. 1. First nozzle assembly 18 further includes support 48 which supports nozzles 20, 22 while second nozzle assembly 30 further includes support 50 which supports nozzles 20. The shape of the nozzles are also schematically illustrated in FIGS. 3A and 3B where it can be seen that nozzles 20, 24, 32 and 34 are relatively large so as to produce a divergent stream of cleaning agent while nozzles 22 are relatively small and aligned so as to produce a parallel stream of cleaning agent. More particularly, nozzles 20, 24, 32 and 34 are commercially available divergent jets that spray in a "flat cone" spray pattern and are arranged in a dual row, offset pattern so that they create a maximum impact across a wide area along a narrow line. Nozzles 22 comprise a plurality of holes (preferably, 0.030 inch diameter holes on 0.066 inch center lines for a pitch/hole diameter ratio of 2.2). The wall thickness of the nozzles 22 is preferably 0.125 inch. With the nozzles 22 having the aforementioned dimensions, the cleaning agent has both a maximum electrical contact area with the screening mask and the diameter to wall thickness profile gives the jets emerging a non-divergent quality, thereby efficiently metering the cleaning agent while providing maximum cleaning.

Figure 4:
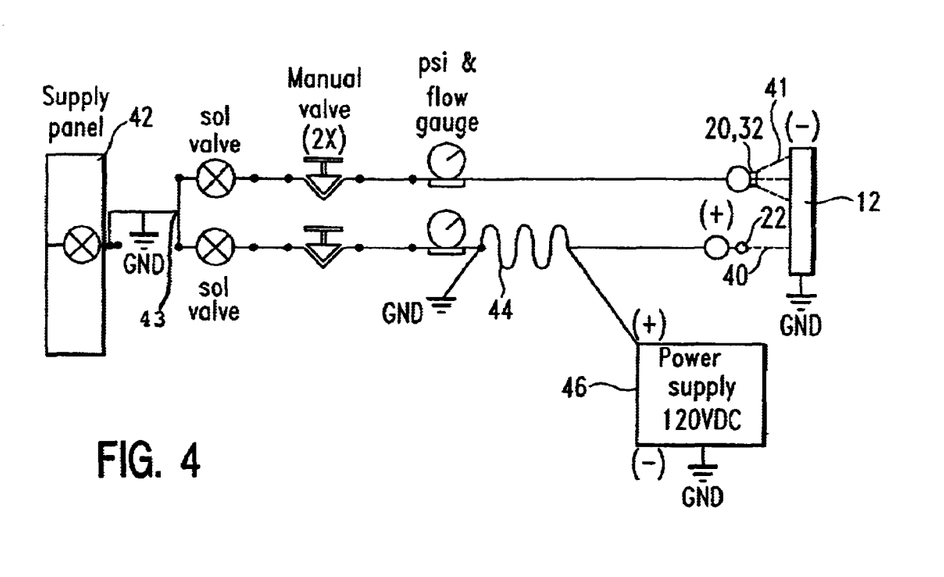
FIG. 4 is a plumbing and electrical layout of the first embodiment of the apparatus according to the present invention and ancillary equipment.

Referring now to FIG. 4, there is shown a schematic illustration of the plumbing and some of the electrical wiring of the apparatus 10. There is a supply panel 42 which controls the flow of a cleaning agent from a reservoir (not shown) of cleaning agent. At a suitable location 43 the flow of the cleaning agent is split so as to feed both the first nozzles 20, 32 and second nozzle 22. The standard plumbing includes suitable valves and flow gauges as shown in FIG. 4 to control the flow of the cleaning agent. The plumbing circuit that feeds second nozzle 22 includes a power supply 46 that is in electrical communication with second nozzle 22. To avoid directing any current back down the plumbing supply line, nozzle 22 and power supply 46 are preferably connected to the remainder of the plumbing by a nonconducting or insulating hose 44 of sufficient length (for example, 25 feet as found by the present inventors) to create a resistance at least an order of magnitude greater than the resistance of the path between the nozzle 22 and the article 12. No such nonconducting hose is necessary in the plumbing circuit for nozzles 20, 32 although a nonconducting hose may be used there is desired. The current flow, then, is from power supply 46 to nozzle 22, through parallel stream 40 of the cleaning agent to article 12 and finally to ground. In this manner, nozzle 22 in conjunction with power supply 46 and the cleaning agent causes electrolytic cleaning of article 12. For completion of the electric circuit, it is necessary for the cleaning agent to have a suitable ionic species in a sufficient quantity and the parallel stream 40 to maintain continuous contact between the nozzle 22 and article 12. Also shown in FIG. 4 is divergent stream 41 from nozzles 20, 30.

Referring to FIGS. 1, 3A and 3B, a further element of the apparatus 10 is a transport apparatus to cause relative movement between the first and second nozzle assemblies 18, 30 and article 12. Article 12 is supported by article support 38. In one embodiment of the present invention, article support 38 can be vertically moveable up and down while the first and second nozzle assemblies 18, 30 are stationary on supports 48, 50. In an alternative embodiment of the present invention, vertical support 38 can be stationary while first and second nozzle assemblies 18, 32 are moveable, either in unison or separately. In this regard, supports 48, 50 would be connected to suitable conventional apparatus which would cause supports 48, 50 to vertically move up and down, in unison or separately, to provide relative motion with respect to article 12. Further, supports 48, 50 may form essentially one U-shaped support which simultaneously supports the nozzles of the first and second nozzle assemblies 18, 30 and article 12 may freely move within the "U" of the U-shaped support.

The first and second nozzle assemblies 18, 30 may optionally include nozzles 24, 34, respectively, for spraying a rinsing fluid such as deionized (DI) water to rinse the cleaning agent from the article 12. Also shown in FIG. 1 are suitable manifolds 26 in the first nozzle assembly 18 and manifolds 36 in the second nozzle assembly 30 for supplying cleaning agent, rinsing fluid and drying fluid to the respective nozzles.

Figure 2:
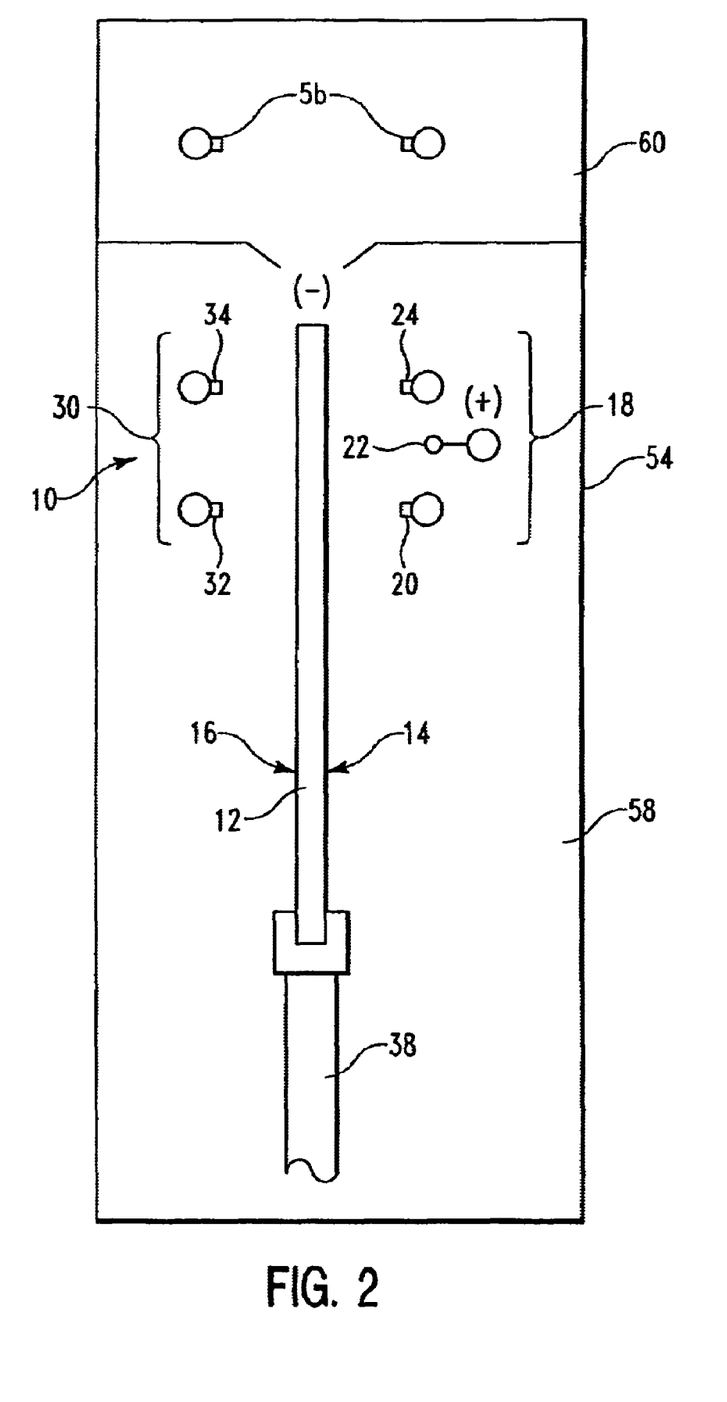
FIG. 2 is a side view schematically illustrating the first embodiment of the apparatus according to the present invention.

Referring now to FIG. 2, apparatus 10 is shown located in a suitable cabinet 54. In one embodiment of the present invention, apparatus 10 is further shown located in a wash chamber 58 of the cabinet 54. There may also be a separate drying chamber 60 in which are located nozzles 56 for drying the article 12. The arrangement of the wash chamber 58, drying chamber 60, rinsing nozzles 24, 34 and drying nozzles 56 shown in FIG. 2 are for purposes of illustration and not limitation. Thus, the foregoing components may be rearranged so that there is only a single chamber in cabinet 54 and drying nozzles 56 are located on first and second nozzle assemblies 18, 30.

Figure 6:
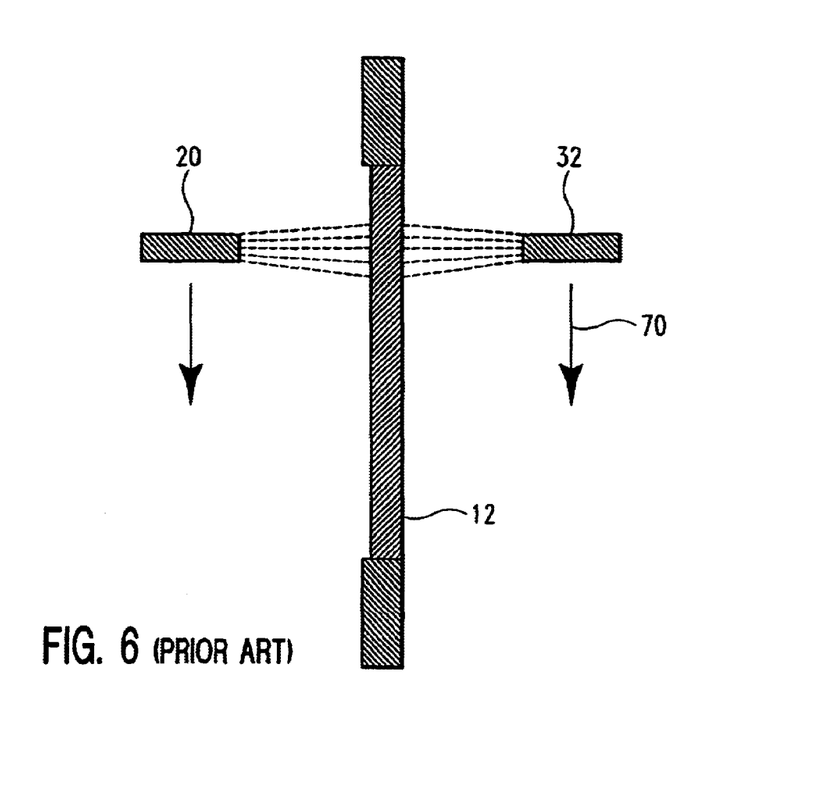
FIG. 6 is a schematic representation of the operation of a apparatus for cleaning articles.

The prior art method of cleaning articles 12 is illustrated in FIG. 6. As shown therein, nozzles 20, 32 pressure spray a cleaning agent onto article 12 while the nozzles 20, 32 are translated downwardly in the direction indicated by arrows 70. Article 12 is held stationary although article 12 could be translated vertically while nozzles 20, 32 are held stationary.

Figure 7A:
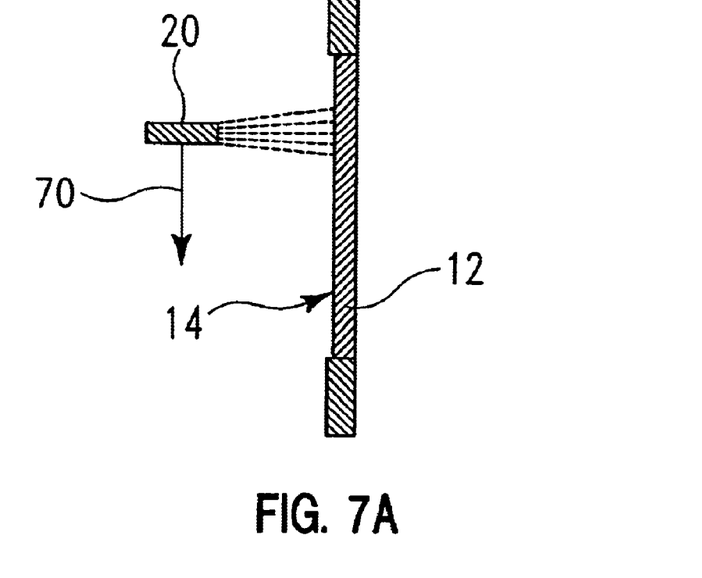
FIGS. 7A and 7B are schematic representations of the operation of a first embodiment of the apparatus according to the present invention for cleaning articles.
Figure 7B:
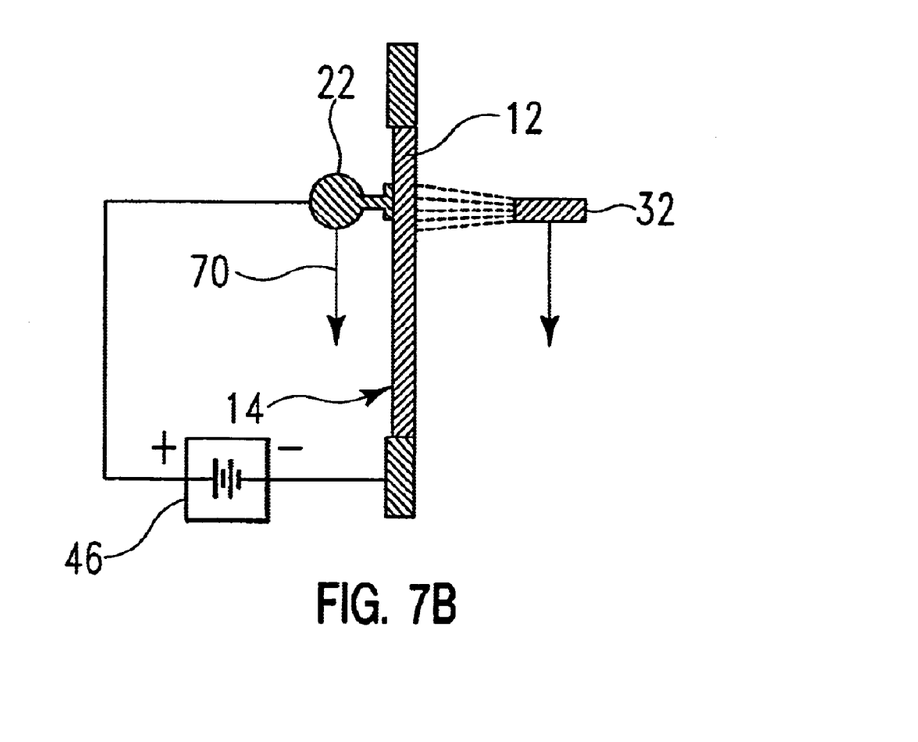

In operation of the apparatus 10, in a first pass the first nozzle 20, 32 of each of the nozzle assemblies 18, 30, respectively, is operable to spray the article 12 with a spray of the cleaning agent as the nozzle assemblies 18, 30 and article 12 are transported with respect to each other to chemically remove residual material from the article. The residual material may be, and preferably is, also mechanically removed. However, in a most preferred embodiment of the present invention as shown in FIG. 7A, only nozzle 20 is operable during the first pass. Also, as shown in FIG. 7A for purposes of illustration and not limitation, nozzle 20 is translated downwardly in the direction of arrow 70 while article 12 is held stationary. In a second pass, most preferably concurrent with a counterbalancing backside spray from nozzle 32, the second nozzle 22 of the first nozzle assembly 18 is operable to spray the front side 14 of article 12 with a cleaning agent as a voltage is applied by power supply 46 between the second nozzle 22 of the first nozzle assembly 18 and the article 12 and as the first nozzle assembly 18 and article 12 are transported with respect to each other to electrochemically remove the remaining residual material from the article 12. The cleaning agent may, and preferably does, also chemically remove the residual material. As noted above, nozzle 32 can also be operable during the first pass but this wastes cleaning agent since nozzle 32 is preferably operable during the second pass to provide mechanical and chemical cleaning of the back side of the article 12. Further, nozzle 22 can be solely operational during the second pass while nozzle 32 is not operational if desired. The latter is not preferred since the operation of nozzle 32 concurrently with nozzle 22 causes pooling of cleaning agent against the front side 14 of the article 12 which increases the effective electrode contact area, thereby increasing the efficiency of the electrolytic cleaning.

Figure 5:
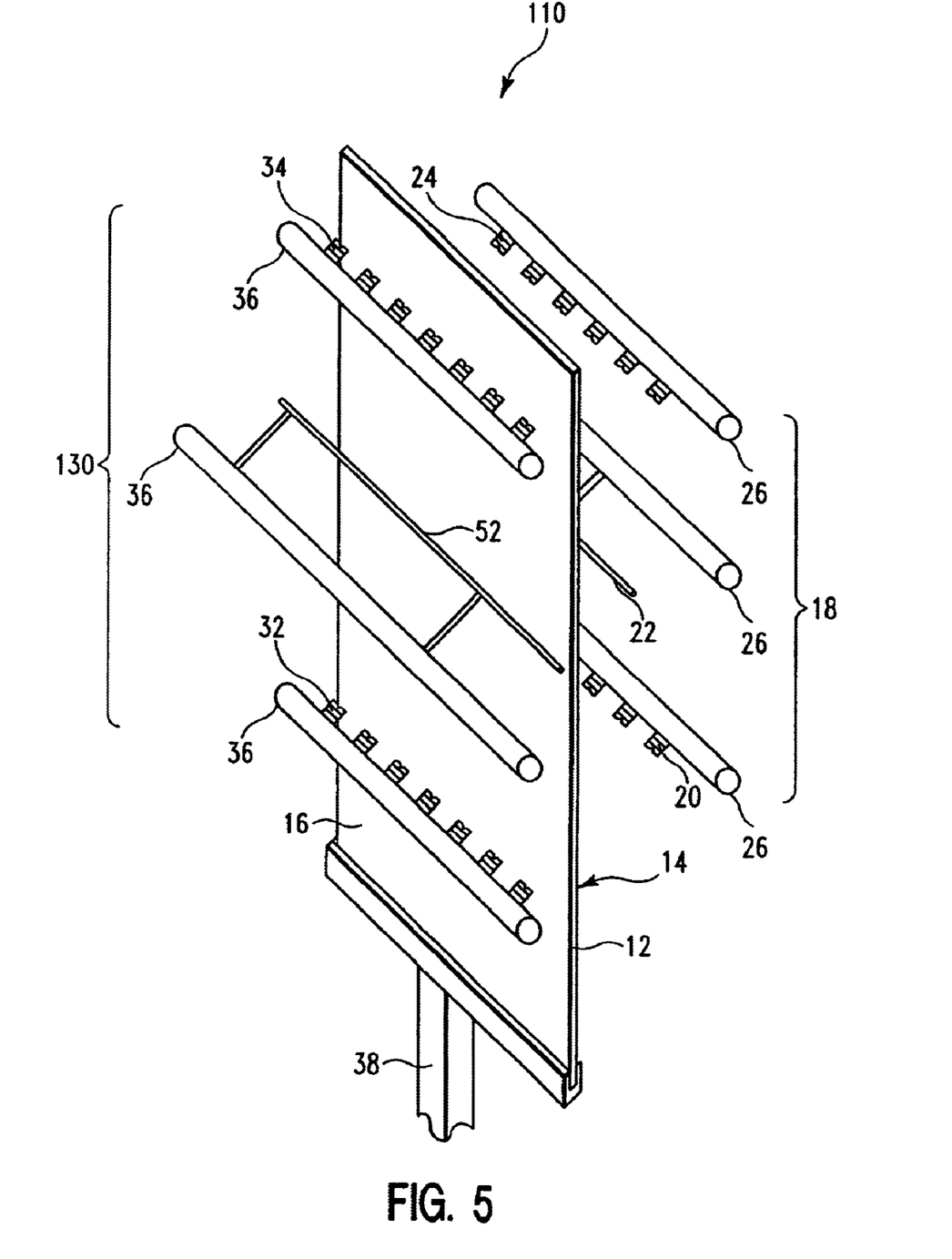
FIG. 5 is a perspective view schematically illustrating another embodiment of the apparatus according to the present invention.

Referring now to FIG. 5, there is shown a further embodiment of the present invention. Apparatus 110 in FIG. 5 is similar to apparatus 10 in FIG. 1 except that second nozzle assembly 130 of apparatus 110 further includes a second nozzle 52, similar to nozzle 22 of first nozzle assembly 18, for spraying the cleaning agent in the second pattern. As so modified, first nozzle assembly 18 and second nozzle assembly 130 work similarly to preferably mechanically, chemically and electrolytically clean the front 14 and back 16 of article 12.

Figure 8A:
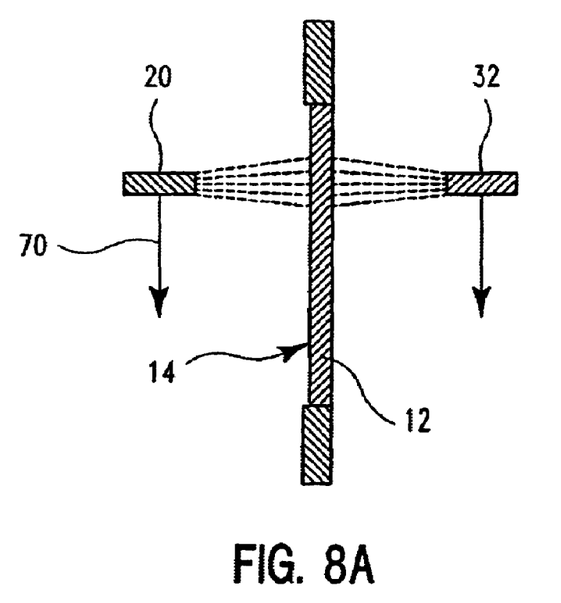
FIGS. 8A and 8B are schematic representations of the operation of a second embodiment of the apparatus according to the present invention for cleaning articles.
Figure 8B:
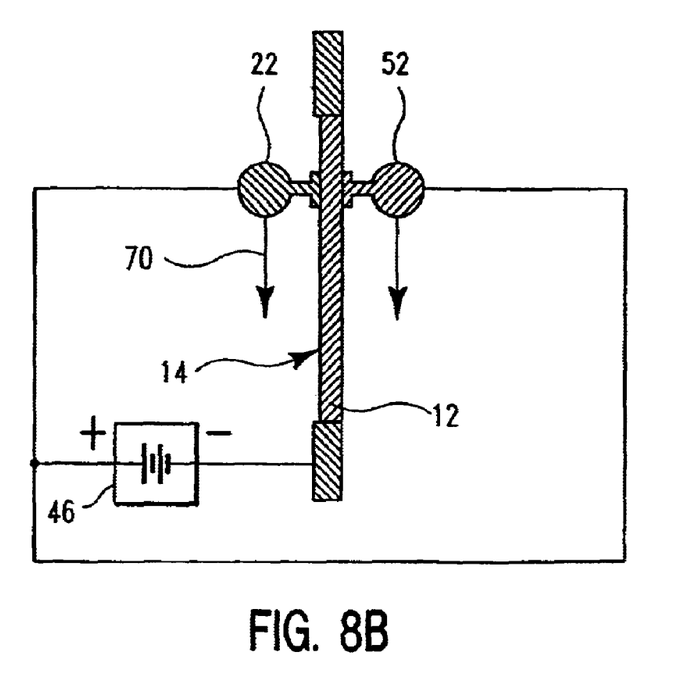

In operation of the apparatus 110, in a first pass as shown in FIG. 8A the first nozzle 20, 32 of each of the nozzle assemblies 18, 130, respectively, is operable to spray the article 12 with a spray of the cleaning agent as the nozzle assemblies 18, 130 and article 12 are transported with respect to each other to only chemically and mechanically remove residual material from the article 12. Again, the first nozzles 20, 32 may also cause mechanical removal of the residual material. In a second pass as shown in FIG. 8B the second nozzles 22, 52 of each of the nozzle assemblies 18, 130, respectively, is operable to spray the article 12 with a cleaning agent as a voltage from power supply 46 is applied between the second nozzles 22, 52 of each of the nozzle assemblies 18, 130, respectively, and the article 12 and as the nozzle assemblies 18, 130 and article 12 are transported with respect to each other to electrochemically remove the remaining residual material from the article 12. Again, the cleaning agent may chemically remove the residual material as well.

It should be understood that while the first and second nozzles of the first and second nozzle assemblies are described with respect to the various embodiments of the present invention as operating sequentially, they may also operate simultaneously. However, simultaneous operation of the first and second nozzles of the first and second nozzle assemblies is not preferred at this time.

The electroclean process according to the present invention is made possible by the formation of a localized electrolytic cell between the article to be cleaned and the electroclean nozzle that is capable of traversing the entire article in a small amount of time, for example, 3–5 seconds. The successful formation of this electrolytic cell is critical to achieving effective electrocleaning. Furthermore, because the article to be cleaned, such as a screening mask, may contain through features, a counter-balancing backside spray is most preferred to prevent the cleaning agent from simply passing through the features of the article.

The electrolytic cell formation is a hydrodynamic process and the following parameters are preferred for good electrolytic cell formation:
- the distance between the article and electroclean nozzle should be as small as possible without risking an electrical short-circuit or mechanical interference between the nozzle assembly and the article to be cleaned;
- the electroclean nozzle angle should be approximately perpendicular to the article surface, with effective electrolytic cell formation being achievable from −20 degrees to +20 degrees off perpendicular;
- the preferred counter-balancing backside nozzle should have an angle with respect to the article similar to the electroclean nozzle and a sufficient flow of the cleaning agent to counterbalance the spray from the electroclean nozzle so as to maximize pooling of the cleaning agent on the face of the article; and
- the flow of the cleaning agent from the electroclean nozzle should be optimized to avoid too little flow which will result in incomplete filling of the gap between the article and the electroclean nozzle and too much flow which will result in destructive backsplashing.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. An apparatus for cleaning residual material from an article comprising:
   a) a source of a cleaning agent;
   b) at least one pair of opposing spray nozzle assemblies directed to spray an article interposed between the opposing spray nozzle assemblies, a first of the opposing spray nozzle assemblies comprising a first nozzle for spraying the cleaning agent in a first pattern and a second nozzle for spraying the cleaning agent in a second pattern, and a second of the opposing spray nozzle assemblies comprising a first nozzle for spraying the cleaning agent in a third pattern;
   c) a supply conduit from the source of the cleaning agent to each of the first and second nozzles;
   d) a power source electrically connected to the second nozzle; and
   e) a transport apparatus to transport one of the opposing nozzle assemblies and the article with respect to each other;
   f) wherein, in operation, in a first pass the first nozzle of at least the first nozzle assembly is operable to spray the article with a spray of the cleaning agent as the first nozzle assembly and article are transported with respect to each other to chemically and mechanically remove residual material from the article and in a second pass the second nozzle of the first nozzle assembly is operable to spray the article with a cleaning agent as a voltage is applied between the second nozzle of the first nozzle assembly and the article and as the first nozzle assembly and article are transported with respect to each other to chemically and electrochemically remove the remaining residual material from the article.

2. The apparatus of claim 1 wherein, in operation, the first nozzle of the second nozzle assembly is operable in conjunction with the first nozzle of the first nozzle assembly during the first pass to chemically and mechanically remove residual material from the article.

3. The apparatus of claim 1, wherein, in operation, the first nozzle of the second assembly is operable in conjunction with the second nozzle of the first nozzle assembly during the second pass to chemically and mechanically remove residual material from the article.

4. The apparatus of claim 1 wherein the first and second nozzle assemblies further comprise a rinsing nozzle and wherein, in operation, in a third pass the rinsing nozzles of the first t and second nozzle assemblies are operable to spray a rinsing fluid on the article as the nozzle assemblies and article are transported with respect to each other to rinse the cleaning agent from the article.

5. The apparatus of claim 1 wherein the supply conduit for at least the second nozzle is insulating and of sufficient length so as to create a resistance that is at least an order of magnitude greater than a resistance between the second nozzle and the article.

6. The apparatus of claim 1 wherein the cleaning agent is tetramethylammonium hydroxide (TMAH).

7. The apparatus of claim 6 wherein the concentration of the TMAH in the spray in the first and second passes is in the range of 0.2 to 2 weight percent.

8. The apparatus of claim 6 wherein the concentration of the TMAH in the spray in the first and second passes is the same.

9. The apparatus of claim 6 wherein the concentration of the TMAH in the spray in the first and second passes is in the range of 0.4 to 0.5 weight percent.

10. The apparatus of claim 1 wherein the second nozzle comprises a plurality of holes through which the cleaning agent is sprayed, the holes having a diameter of 0.030 inches with a center to center pitch spacing of 0.066 for a pitch/hole diameter ratio of 2.2.

11. The apparatus of claim 1 wherein the article is a metallic screening mask.

12. The apparatus of claim 1 wherein the residual material is a metal-containing paste.

13. An apparatus for cleaning residual material from an article comprising:
   a) a source of a cleaning agent;
   b) at least one pair of opposing spray nozzle assemblies directed to spray an article interposed between the opposing spray nozzle assemblies with each of the opposing spray nozzle assemblies comprising a first nozzle for spraying the cleaning agent in a first pattern and a second nozzle for spraying the cleaning agent in a second pattern;
   c) a supply conduit from the source of the cleaning agent to each of the first and second nozzles;
   d) a power source electrically connected to the second nozzles; and
   e) a transport apparatus to transport one of the opposing nozzle assemblies and the article with respect to each other;
   f) wherein, in operation, in a first pass the first nozzle of each of the nozzle assemblies is operable to spray the article with a spray of the cleaning agent as the nozzle assemblies and article are transported with respect to each other to chemically and mechanically remove residual material from the article and in a second pass the second nozzles of each of the nozzle assemblies is operable to spray the article with a cleaning agent as a voltage is applied between the second nozzles of each of the nozzle assemblies and the article and as the nozzle assemblies and article are transported with respect to each other to chemically and electrochemically remove the remaining residual material from the article.

14. The apparatus of claim 13 wherein the first and second nozzle assemblies further comprise a rinsing nozzle and wherein, in operation, in a third pass the rinsing nozzles of the first and second nozzle assemblies are operable to spray a rinsing fluid on the article as the nozzle assemblies and article are transported with respect to each other to rinse the cleaning agent from the article.

15. The apparatus of claim 14 wherein the supply conduit for at least the second nozzles is insulating and of sufficient length so as to create a resistance that is at least an order of magnitude greater than a resistance between the second nozzles and the article.

16. The apparatus of claim 13 wherein the cleaning agent is tetramethylammonium hydroxide (TMAH).

17. The apparatus of claim 16 wherein the concentration of the TMAH in the spray in the first and second passes is in the range of 0.2 to 2 weight percent.

18. The apparatus of claim 16 wherein the concentration of the TMAH in the spray in the first and second passes is the same.

19. The apparatus of claim 16 wherein the concentration of the TMAH in the spray in the first and second passes is in the range of 0.4 to 0.5 weight percent.

20. The apparatus of claim 13 wherein the second nozzles comprise a plurality of holes through which the cleaning agent is sprayed, the holes having a diameter of 0.030 inches with a center to center pitch spacing of 0.066 for a pitch/hole diameter ratio of 2.2.

21. The apparatus of claim 13 wherein the article is a metallic screening mask.

22. The apparatus of claim 13 wherein the residual material is a metal-containing paste.

* * * * *